(12) United States Patent
Chang et al.

(10) Patent No.: US 11,114,563 B2
(45) Date of Patent: Sep. 7, 2021

(54) SEMICONDUCTOR DEVICES WITH LOW JUNCTION CAPACITANCES AND METHODS OF FABRICATION THEREOF

(71) Applicant: Taiwan Semiconductor Manufacturing Company, Ltd., Hsinchu (TW)

(72) Inventors: Cheng-Hung Chang, Hsinchu (TW); Yu-Rung Hsu, Tainan (TW); Chen-Hua Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/942,639

(22) Filed: Apr. 2, 2018

(65) Prior Publication Data
US 2018/0226506 A1 Aug. 9, 2018

Related U.S. Application Data

(60) Continuation of application No. 13/616,194, filed on Sep. 14, 2012, now Pat. No. 9,935,197, which is a
(Continued)

(51) Int. Cl.
*H01L 29/78* (2006.01)
*H01L 21/8238* (2006.01)
(Continued)

(52) U.S. Cl.
CPC .. *H01L 29/7833* (2013.01); *H01L 21/823878* (2013.01); *H01L 21/84* (2013.01);
(Continued)

(58) Field of Classification Search
CPC ......... H01L 29/7833; H01L 21/823878; H01L 27/123
See application file for complete search history.

(56) References Cited

U.S. PATENT DOCUMENTS 5,972,758 A   10/1999  Liang
6,355,532 B1   3/2002  Seliskar et al.
(Continued)

FOREIGN PATENT DOCUMENTS

CN   1681103 A   10/2005
CN   1921116 A   2/2007
(Continued)

OTHER PUBLICATIONS

Balakumar, S. et al., "Fabrication of high Ge content SiGe layer on Si by Ge condensation technique" Proceedings of the 13th IPFA 2006, Singapore, IEEE, pp. 301-305.
(Continued)

*Primary Examiner* — Sarah K Salerno
(74) *Attorney, Agent, or Firm* — Slater Matsil, LLP

(57) ABSTRACT

Semiconductor devices with low junction capacitances and methods of fabrication thereof are described. In one embodiment, a method of forming a semiconductor device includes forming isolation regions in a substrate to form active areas. The sidewalls of the active areas are enclosed by the isolation regions. The isolation regions are recessed to expose first parts of the sidewalls of the active areas. The first parts of the sidewalls of the active areas are covered with spacers. The isolation regions are etched to expose second parts of the sidewalls of the active area, the second parts being disposed below the first parts. The active areas are etched through the exposed second parts of the sidewalls to form lateral openings. The lateral openings are filled with a spin on dielectric.

20 Claims, 16 Drawing Sheets

Related U.S. Application Data division of application No. 12/618,505, filed on Nov. 13, 2009, now Pat. No. 8,293,616.

(60) Provisional application No. 61/154,921, filed on Feb. 24, 2009.

(51) Int. Cl.
 *H01L 21/84*    (2006.01)
 *H01L 27/12*    (2006.01)
 *H01L 29/06*    (2006.01)
 *H01L 29/66*    (2006.01)
 *H01L 29/788*    (2006.01)
 *H01L 29/792*    (2006.01)
 *H01L 21/762*    (2006.01)

(52) U.S. Cl.
 CPC ...... *H01L 27/1203* (2013.01); *H01L 27/1207* (2013.01); *H01L 29/0653* (2013.01); *H01L 29/66636* (2013.01); *H01L 29/7881* (2013.01); *H01L 29/792* (2013.01); *H01L 21/76224* (2013.01); *H01L 21/76264* (2013.01); *H01L 29/6653* (2013.01); *H01L 29/6659* (2013.01)

(56) References Cited

U.S. PATENT DOCUMENTS

| | | | |
|---|---|---|---|
| 6,376,286 B1 | 4/2002 | Ju | |
| 6,429,091 B1 | 8/2002 | Chen et al. | |
| 6,448,115 B1 | 9/2002 | Bae | |
| 6,599,789 B1* | 7/2003 | Abbott | H01L 29/0653 438/161 |
| 6,706,571 B1 | 3/2004 | Yu et al. | |
| 6,858,478 B2 | 2/2005 | Chau et al. | |
| 6,909,147 B2 | 6/2005 | Aller et al. | |
| 6,914,277 B1 | 7/2005 | Hill et al. | |
| 6,936,522 B2* | 8/2005 | Steegen | H01L 21/823481 257/E21.426 |
| 6,936,875 B2 | 8/2005 | Sugii et al. | |
| 6,972,478 B1* | 12/2005 | Waite | H01L 21/823807 257/347 |
| 7,078,722 B2 | 7/2006 | Anderson et al. | |
| 7,180,134 B2 | 2/2007 | Yang et al. | |
| 7,190,050 B2 | 3/2007 | King et al. | |
| 7,208,796 B2 | 4/2007 | Chang et al. | |
| 7,221,006 B2 | 5/2007 | Orlowski et al. | |
| 7,247,887 B2 | 7/2007 | King et al. | |
| 7,256,078 B2 | 8/2007 | Anderson et al. | |
| 7,265,008 B2 | 9/2007 | King et al. | |
| 7,297,600 B2 | 11/2007 | Oh et al. | |
| 7,320,908 B2 | 1/2008 | Son et al. | |
| 7,332,386 B2 | 2/2008 | Lee et al. | |
| 7,352,034 B2 | 4/2008 | Booth, Jr. et al. | |
| 7,396,726 B2 | 7/2008 | Oh et al. | |
| 7,479,421 B2 | 1/2009 | Kavalieros et al. | |
| 7,495,285 B2 | 2/2009 | Lee | |
| 7,508,031 B2 | 3/2009 | Liu et al. | |
| 7,528,465 B2 | 5/2009 | King et al. | |
| 7,544,994 B2 | 6/2009 | Schepis et al. | |
| 7,560,785 B2 | 7/2009 | Yu et al. | |
| 7,605,449 B2 | 10/2009 | Liu et al. | |
| 7,638,843 B2 | 12/2009 | Xiang et al. | |
| 7,655,989 B2 | 2/2010 | Zhu et al. | |
| 7,662,679 B2 | 2/2010 | Izumida et al. | |
| 7,666,721 B2 | 2/2010 | Dyer et al. | |
| 7,683,417 B2 | 3/2010 | Xiong et al. | |
| 7,709,303 B2 | 5/2010 | Burnett et al. | |
| 7,728,324 B2 | 6/2010 | Tezuka et al. | |
| 7,745,871 B2 | 6/2010 | Oh et al. | |
| 7,781,273 B2 | 8/2010 | Schepis et al. | |
| 7,820,551 B2 | 10/2010 | Yagishita et al. | |
| 7,843,000 B2 | 11/2010 | Yu et al. | |
| 7,879,677 B2 | 2/2011 | Lee | |
| 7,936,006 B1* | 5/2011 | Luo | H01L 21/823807 257/327 |
| 8,022,478 B2 | 9/2011 | Anderson et al. | |
| 8,039,843 B2 | 10/2011 | Inaba | |
| 8,048,723 B2 | 11/2011 | Chang et al. | |
| 8,106,459 B2 | 1/2012 | Chang et al. | |
| 8,263,462 B2 | 9/2012 | Hung et al. | |
| 8,466,511 B2 | 6/2013 | Oh et al. | |
| 9,048,259 B2 | 6/2015 | Hung et al. | |
| 9,230,959 B2 | 1/2016 | Chang et al. | |
| 2002/0190344 A1 | 12/2002 | Michejda et al. | |
| 2004/0150029 A1 | 8/2004 | Lee | |
| 2004/0256683 A1 | 12/2004 | Lee et al. | |
| 2005/0077553 A1 | 4/2005 | Kim et al. | |
| 2005/0153490 A1 | 7/2005 | Yoon et al. | |
| 2005/0199919 A1 | 9/2005 | Liu et al. | |
| 2005/0224875 A1 | 10/2005 | Anderson et al. | |
| 2005/0250279 A1 | 11/2005 | Son et al. | |
| 2005/0260806 A1* | 11/2005 | Chang | H01L 21/823807 438/197 |
| 2005/0269629 A1 | 12/2005 | Lee et al. | |
| 2005/0272190 A1 | 12/2005 | Lee et al. | |
| 2005/0272192 A1 | 12/2005 | Oh et al. | |
| 2006/0060856 A1 | 3/2006 | Anderson et al. | |
| 2006/0076625 A1 | 4/2006 | Lee et al. | |
| 2006/0170053 A1 | 8/2006 | Yeo et al. | |
| 2006/0281245 A1 | 12/2006 | Okuno et al. | |
| 2006/0286724 A1 | 12/2006 | Anderson et al. | |
| 2006/0292781 A1 | 12/2006 | Lee | |
| 2007/0045748 A1 | 3/2007 | Booth, Jr. et al. | |
| 2007/0075372 A1 | 4/2007 | Terashima et al. | |
| 2007/0120156 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0145431 A1 | 6/2007 | Kim et al. | |
| 2007/0161171 A1 | 7/2007 | Burnett et al. | |
| 2007/0170474 A1 | 7/2007 | Kawasaki | |
| 2007/0172996 A1 | 7/2007 | Mathew et al. | |
| 2007/0176235 A1* | 8/2007 | Tsujiuchi | H01L 21/84 257/347 |
| 2007/0221956 A1 | 9/2007 | Inaba | |
| 2008/0001171 A1 | 1/2008 | Tezuka et al. | |
| 2008/0006908 A1 | 1/2008 | Lin et al. | |
| 2008/0029828 A1 | 2/2008 | Oh et al. | |
| 2008/0048265 A1 | 2/2008 | Booth, Jr. et al. | |
| 2008/0050866 A1 | 2/2008 | Booth, Jr. et al. | |
| 2008/0050918 A1 | 2/2008 | Damlencourt | |
| 2008/0061370 A1 | 3/2008 | Matsuo | |
| 2008/0122013 A1 | 5/2008 | Schepis et al. | |
| 2008/0128796 A1 | 6/2008 | Zhu et al. | |
| 2008/0128797 A1 | 6/2008 | Dyer et al. | |
| 2008/0157225 A1 | 7/2008 | Datta et al. | |
| 2008/0171407 A1 | 7/2008 | Nakabayashi et al. | |
| 2008/0191271 A1 | 8/2008 | Yagishita et al. | |
| 2008/0230852 A1 | 9/2008 | Yu et al. | |
| 2008/0237641 A1 | 10/2008 | Oh et al. | |
| 2008/0265338 A1 | 10/2008 | Yu et al. | |
| 2008/0274595 A1* | 11/2008 | Spencer | H01L 21/76283 438/154 |
| 2008/0290470 A1 | 11/2008 | King et al. | |
| 2008/0296632 A1 | 12/2008 | Moroz et al. | |
| 2009/0020792 A1 | 1/2009 | Rios et al. | |
| 2009/0057846 A1 | 3/2009 | Doyle et al. | |
| 2009/0072276 A1 | 3/2009 | Inaba | |
| 2009/0103316 A1 | 4/2009 | Kiong et al. | |
| 2009/0159972 A1 | 6/2009 | Jakschik et al. | |
| 2009/0181477 A1 | 7/2009 | King et al. | |
| 2009/0206446 A1 | 8/2009 | Russ et al. | |
| 2009/0209074 A1 | 8/2009 | Anderson et al. | |
| 2009/0250769 A1 | 10/2009 | Yu et al. | |
| 2009/0253266 A1 | 10/2009 | Yu et al. | |
| 2009/0278196 A1 | 11/2009 | Chang et al. | |
| 2010/0002494 A1 | 1/2010 | Xiong et al. | |
| 2010/0025740 A1 | 2/2010 | Lee | |
| 2010/0035398 A1 | 2/2010 | Oh et al. | |
| 2010/0041198 A1 | 2/2010 | Zhu et al. | |
| 2010/0044784 A1 | 2/2010 | Oh et al. | |
| 2010/0144121 A1 | 6/2010 | Chang et al. | |

(56) References Cited

U.S. PATENT DOCUMENTS

| | | |
|---|---|---|
| 2010/0163971 A1 | 7/2010 | Hung et al. |
| 2010/0164102 A1 | 7/2010 | Rachmady et al. |
| 2010/0187656 A1 | 7/2010 | Ke et al. |
| 2010/0213548 A1 | 8/2010 | Chang et al. |
| 2011/0037129 A1 | 2/2011 | Yu et al. |
| 2011/0193141 A1 | 8/2011 | Lin et al. |
| 2012/0025313 A1 | 2/2012 | Chang et al. |
| 2012/0083107 A1 | 4/2012 | Chang et al. |
| 2012/0299110 A1 | 11/2012 | Hung et al. |
| 2013/0234215 A1 | 9/2013 | Okano |
| 2015/0262861 A1 | 9/2015 | Hung et al. |
| 2016/0133703 A1 | 5/2016 | Chang et al. |
| 2018/0123611 A1 | 5/2018 | Dutton et al. |

FOREIGN PATENT DOCUMENTS

| | | |
|---|---|---|
| CN | 101038936 A | 9/2007 |
| CN | 101097954 A | 1/2008 |
| JP | 2008141177 A | 6/2008 |

OTHER PUBLICATIONS

Balakumar, S. et al., "Fabrication of Thick Germanium-on-Insulator (GeOI) Substrates" Journal of Electronic Materials, vol. 37, No. 7, 2008 (pp. 944-950).

Hisamoto, D. et al., "A Fully Depleted Lean-channel Transistor (DELTA)" A Novel Vertical Ultra-Thin SOI MOSFET International Electron Devices Meeting, 1989, pp. 833-836, Hitachi Ltd., Japan.

Kanemura, T. et al., "Improvement of Drive Current in Bulk-FinFET using Full 3D Process/Device Simulations" International Conference on Simulation of Semiconductor Processes and Devices, 2006, pp. 131-134, Toshiba Corporation, Japan.

Liow, T.Y. et al., "Investigation of Silicon-Germanium Fins Fabricated Using Germanium Condensation on Vertical Compliant Structures" Applied Physics Letters, vol. 87, 2005, pp. 262104-1-262104-3.

Okano, K. et al., "Process Integration Technology and Device Characteristics of CMOS FinFET on Bulk Silicon Substrate with sub-10 nm Fin Width and 20 nm Gate Length" International Electron Devices Meeting, 2005, 4 pages, Toshiba Corporation, Japan.

Takagi, S. et al., "Carrier-Transport-Enhanced Channel CMOS for Improved Power Consumption and Performance" IEEE Transactions on Electron Devices" vol. 55, No. 1, Jan. 2008, pp. 21-39.

Tezuka, T. et al., "A Novel Fabrication Technique of Ultrathin and Relaxed SiGe Buffer Layers with High Ge Fraction for Sub-100 nm Strained Silicon-On-Insulator MOSFETs" Jpn. J. Appl. Phys., vol. 40, Part 1, No. 4B, Apr. 2001, pp. 2866-2874.

Wolf, S., "Silicon Processing for the VLSI Era," vol. 2: Process Integration, 1990, Lattice Press, vol. 2., p. 229.

* cited by examiner

SEMICONDUCTOR DEVICES WITH LOW JUNCTION CAPACITANCES AND METHODS OF FABRICATION THEREOF

This application is a continuation of U.S. patent application Ser. No. 13/616,194, entitled "Semiconductor Devices with Low Junction Capacitances," filed Sep. 14, 2012, which is a divisional of U.S. patent application Ser. No. 12/618,505, entitled "Methods of Fabrication of Semiconductor Devices with Low Capacitance," filed Nov. 13, 2009, now U.S. Pat. No. 8,293,616, which claims the benefit of U.S. Provisional Application No. 61/154,921, entitled "Semiconductor Devices with Low Junction Capacitances and Methods of Fabrication Thereof," filed on Feb. 24, 2009, which is incorporated herein by reference.

CROSS-REFERENCE TO RELATED APPLICATIONS

This application relates to the following co-pending and commonly assigned patent application: Ser. No. 12/116,074, filed May 6, 2008, now U.S. Pat. No. 8,106,459, entitled "FinFETs Having Dielectric Punch-Through Stoppers," which application is hereby incorporated herein by reference.

TECHNICAL FIELD

The present invention relates generally to semiconductor devices, and more particularly to semiconductor devices with low junction capacitances and methods of fabrication thereof.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. Silicon on insulator (SOI) devices have been recognized as one of the possible solutions to enable continued scaling. SOI devices offer a number of advantages over bulk devices. In particular, SOI devices exhibit very low junction capacitance compared to bulk devices. The source and drain junction capacitances are almost entirely eliminated. As the buried oxide in a SOI is typically quite thick, the capacitance increase from the buried oxide is minimal. Further, SOI devices do not have body contact. Hence, unlike bulk devices, there is no body effect. The threshold voltage of stacked SOI devices is not degraded by the body effect since the body potential is not tied to a ground potential or a drain potential (Vdd) (since the body potential can rise to the same potential as the source). Finally unlike bulk devices, SOI devices have better soft error immunity. SOI devices improve soft error rate because the buried oxide blocks ionizing radiation from entering the transistor channel.

However, implementing a SOI technology requires extensive circuit design due to the different behavior of the SOI devices, which differs significantly from that of bulk devices. Cell layout and sizing are very different when using SOI technologies due to the unique electrical features of SOI devices. Consequently, direct migration of existing bulk CMOS libraries to a CMOS/SOI process is not possible. Hence, SOI technologies require an independent design kit composed of a library of standard cells (or gates), input/output cells (I/Os), and RAM and ROM compilers. Such libraries need to account for the peculiarities of each device technology. For example, for partially depleted SOI technologies, the design libraries should include propagation-delay variations caused by floating-body effects. The threshold voltage of such devices is affected by external variations that change with time. Hence, the speed of a transistor at a given time depends on its previous states (history effect). This history effect must be accounted for in the design library. The added design complexity and incompatibility with bulk devices require additional development cost, a disadvantage with adopting SOI technologies. Further, SOI starting substrates are expensive, further increasing the implementation of a SOI technology.

Hence, what is needed are structures and methods of fabricating thereof that use the cost advantages of bulk devices while leveraging the performance gains possible with SOI devices.

SUMMARY

These and other problems are generally solved or circumvented, and technical advantages are generally achieved, by preferred embodiments of the present invention.

Embodiments of the invention include semiconductor devices with low junction capacitances and methods of fabrication thereof. In accordance with an embodiment of the present invention, a method of forming a semiconductor device comprises forming isolation regions in a substrate to form active areas, the sidewalls of the active areas being enclosed by the isolation regions, and recessing the isolation regions to expose first parts of the sidewalls of the active areas. The method comprises covering the first parts of the sidewalls of the active areas with spacers, and etching the isolation regions to expose second parts of the sidewalls of the active area, the second parts being disposed below the first parts. The method further comprises etching the active areas through the exposed second parts of the sidewalls to form lateral openings, and filling the lateral openings with a spin on dielectric.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes

FIG. 3, which includes

FIG. 4, which includes

FIG. 6, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
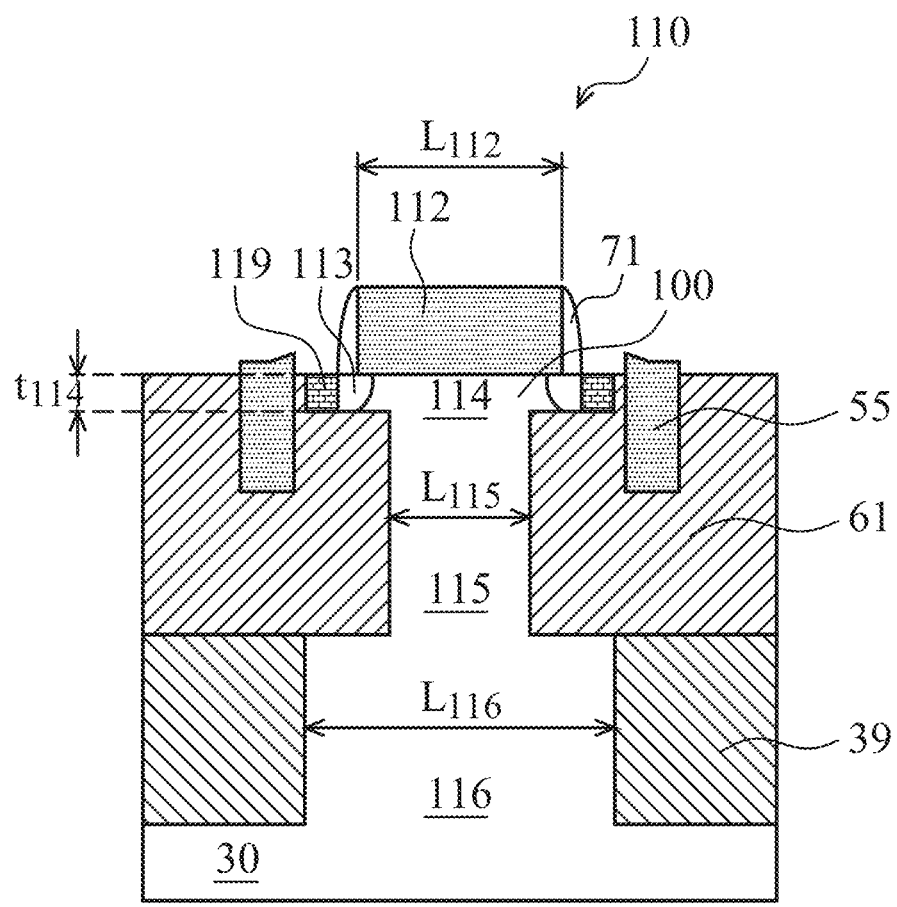
FIG. 1 illustrates an embodiment of the invention illustrating a transistor, wherein the source/drain regions are at least partially disposed on an insulating material.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely field effect transistors with low junction capacitance. The invention may also be applied, however, to other semiconductor devices with similar structures, for example, to improve the junction of a doped region.

Silicon on insulator (SOI) devices are either fully depleted or partially depleted devices. Depending on the thickness of the silicon layer above the insulator layer of the SOI wafer, MOSFETs will operate in fully depleted or partially depleted regimes. Partially depleted transistors are built on relatively thick silicon layers with the gate depletion depths of the MOS channel shallower than the thickness of the silicon layer. In contrast, when the gate depletion region extends through the entire thickness of the silicon layer, the transistor operates in a fully depleted mode. Hence, in a fully depleted SOI device the silicon layer has a thickness that is less than the maximum gate depletion layer width in the silicon during device operation. Consequently, the silicon layer of the fully depleted SOI device is fully depleted before the threshold voltage is reached.

One of the challenges in designing partially depleted SOI devices is the floating body effect, which is a consequence of the complete isolation of the SOI transistor from the substrate. The effect is related to the built-up of a charge in the silicon body of the transistor, for example, originating from the charge created by impact ionization at the drain of the transistor. This charge can not be removed rapidly enough and is retained in the neutral floating body (below the gate depletion), primarily because no contact with the Si film (body) is available. Consequences of the floating body effect include kink-effect; negative conductance and transconductance, hysteresis and instabilities, single transistor latch (the transistor cannot be turned off by reducing gate voltage), bipolar transistor action, and premature breakdown. Floating body effect can lead to circuit instabilities, frequency-dependent delay time, and pulse stretching. In various embodiments, the present invention overcomes these problems by coupling a portion of the channel with the substrate while leveraging many of the advantages of SOI devices. Hence, the charge generated by impact ionization is removed through the substrate/body contact.

Fully depleted SOI devices have an advantage over partially depleted transistors and bulk transistors in that they may be scaled to shorter gate lengths, and do not suffer from body effects due to the fact that the body is fully depleted during device operation. The absence of a neutral floating body minimizes the floating effects such as kink effects. Fully depleted SOI devices can also provide lower off-state leakage currents, higher speeds, fewer soft errors, lower operating voltages and lower gate delay. Hence, new technologies are moving towards fully depleted devices.

However, since fully depleted SOI devices are formed on a thin layer of silicon overlying a layer of insulating material, the body is not coupled to the underlying semiconductor substrate. The lack of body contact makes it difficult to fabricate different types of transistors, or transistors having different operating characteristics, on the same chip. For example, designing multiple transistors at the same gate length with different threshold voltages would be difficult. Bulk transistors, on the other hand, allow such different transistors to be made at the same time. In various embodiments, the present invention overcomes these limitations by forming fully depleted transistors and bulk transistors in the same substrate.

Another disadvantage with the SOI-MOSFETS arises from the higher cost associated with the production of the SOI substrate which requires special processing unlike bulk wafers. In various embodiments, the present invention uses bulk wafers to form devices that are traditionally only fabricated in a SOI wafer.

A structural embodiment of the invention illustrating a single transistor will be described using FIG. 1. Further structural embodiments will be described in FIG. 2. Structural embodiments comprising multiple transistor structures will be described using FIG. 3. An embodiment of a non-volatile memory transistor is described using FIG. 4. An embodiment of a method of fabrication of the semiconductor device is illustrated in FIG. 5.

FIG. 1 illustrates an embodiment of the invention illustrating a transistor, wherein the source/drain regions are at least partially disposed on an insulating material.

A first transistor 110 is disposed in a first active region 100 of a substrate 30. The first transistor 110 with a first gate length L112 comprises a first gate stack 112 disposed over the first active region 100. The first gate stack 112 is disposed between first source/drain regions 113. An outer edge of the source/drain regions 113 is surrounded by spacers 55. The source/drain regions 113 further comprise contact regions 119, for example, comprising silicide regions. In various embodiments, the first gate stack 112 comprises a gate dielectric and a gate electrode, or a non volatile memory gate stack. In one embodiment, the first gate stack 112 comprises a gate dielectric, a floating gate electrode disposed on the gate dielectric, an inter level dielectric disposed on the floating gate, and a control gate disposed on the inter level dielectric.

The first channel 114 of the first transistor 110 is coupled to the substrate 30 through a first portion of first active region 115 and a second portion of first active region 116. The source/drain regions 113 comprise highly doped regions of a first conductivity type, whereas the first channel 114 comprises an opposite second conductivity type. In various embodiments, the width of the first portion of first active region 115 (L115) is less than the width of the second portion of first active region 116 (L116). In one embodiment, the first gate length L112 is larger than the width of the first portion of first active region 115 (L115). The sidewalls of the first portion of first active region 115 are enclosed with a spin on dielectric 61. The sidewalls of the second portion of first active region 116 are enclosed with a dielectric material 39. In various embodiments, a first thickness t114 of the first channel 114 is about 10 nm to about 150 nm, and about 15 nm to about 30 nm in one embodiment.

In various embodiments, the bottom surface of the first source/drain regions 113 is at least partially disposed on the spin on dielectric 61. The junction capacitance of first source/drain regions 113 is reduced dramatically and approaches the junction capacitance of fully depleted SOI devices when a substantial part of the bottom surface of the first source/drain regions 113 is disposed on the spin on dielectric 61. Consequently, in various embodiments, the junction capacitance of the first transistor 110 is advantageously similar to SOI devices, while unlike SOI devices the first transistor 110 does not exhibit floating body effects.

Further, the first transistor 110 is relatively insensitive to process variations. For example, the width of the first portion of first active region L115 may vary due to process variations. However, the threshold voltage of the first transistor 110 is relatively undisturbed, particularly when the first portion of first active region L115 is about the same or larger than the first gate length L112.

The absence of floating body effects mitigates the need for additional circuit libraries associated with floating body devices. Further, unlike SOI devices, back biasing schemes may be implemented to minimize leakage currents due to the presence of the body contact. In various embodiments, a raised source/drain region (not shown) may be formed to improve the source/drain resistance.

The reduction in area of the source/substrate and the drain/substrate junctions while reducing junction capacitance also reduces leakage mechanisms. Hence, junction leakage currents are substantially reduced as in SOI devices. Further, the absence of parasitic transistors enables the device to be used for other applications that require minimizing parasitic effects. For example, the parasitic PNP transistor formed on a bulk PMOS transistor is almost completely deactivated in the first transistor 110 illustrated in FIG. 1.

FIG. 2, which includes FIGS. 2*a*-2*d*, illustrates a semiconductor device in accordance with embodiments of the invention.

Figure 2A:
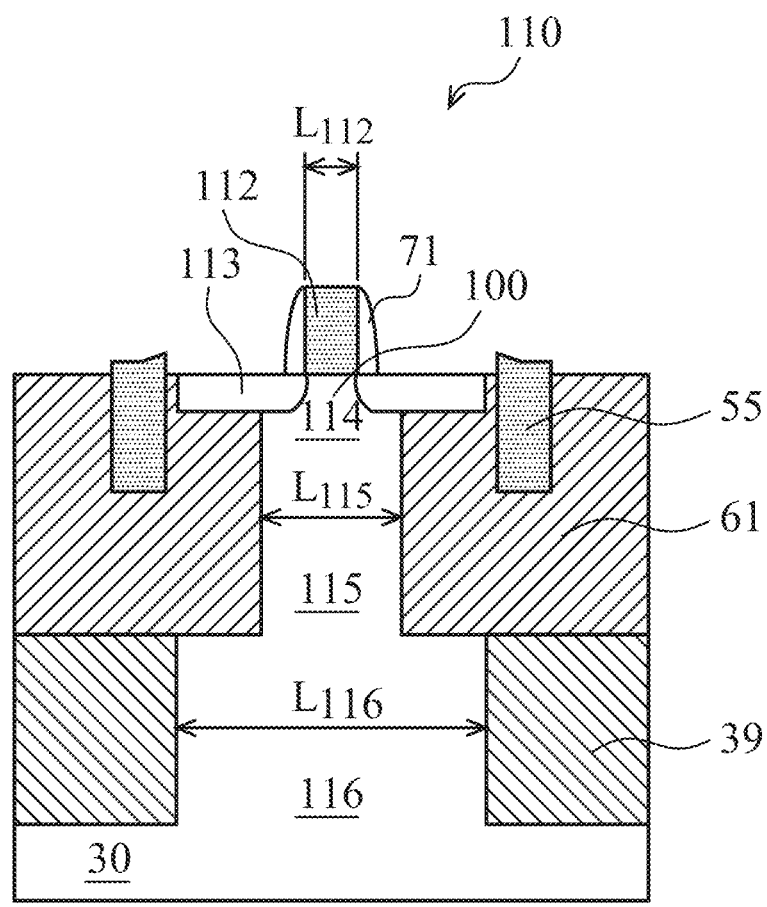
FIGS. 2a-2d, illustrates a semiconductor device in accordance with embodiments of the invention.

FIG. 2*a* illustrates an embodiment of a first transistor 110 in which the first gate length L112 is smaller than the width of the first portion of first active region 115 (L115). Hence, in this embodiment, the source/drain regions 113 are only partially disposed on the spin on dielectric 61. Consequently, the reduction in junction capacitance is partial compared to a fully depleted SOI device.

Figure 2B:
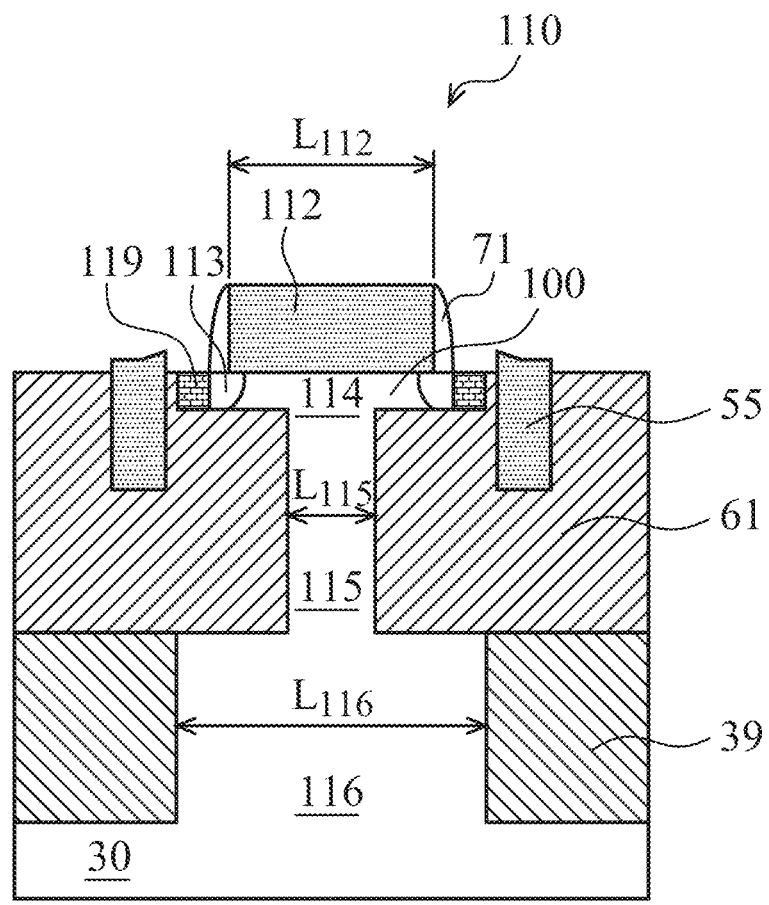

FIG. 2*b* illustrates an alternative embodiment of a first transistor 110 in which the first gate length L112 is larger than the width of the first portion of first active region 115 (L115). Similar to the embodiment described in FIG. 1, the device performance is enhanced due to the reduction in junction capacitance and parasitic leakage paths. The body of the device as in prior embodiments is not floated, but is still coupled to the substrate through the first portion of first active region 115. However, in this embodiment, the gate depletion region (near the source and drain of the transistor) is partially cut-off by the spin on dielectric 61, resulting in improved electrostatics. The protruding spin on dielectric 61 under the channel 114 reduces drain induced barrier lowering. Further, unlike fully depleted devices that have a back side depletion region, and possibly a drain induced barrier lowering on the back interface of the silicon film for the opposite charge carrier, no such effect is present here. The smaller width of the first portion of first active region L115 also enhances the reliability of the device by enclosing the channel area, and hence reduces soft error rates.

Figure 2C:
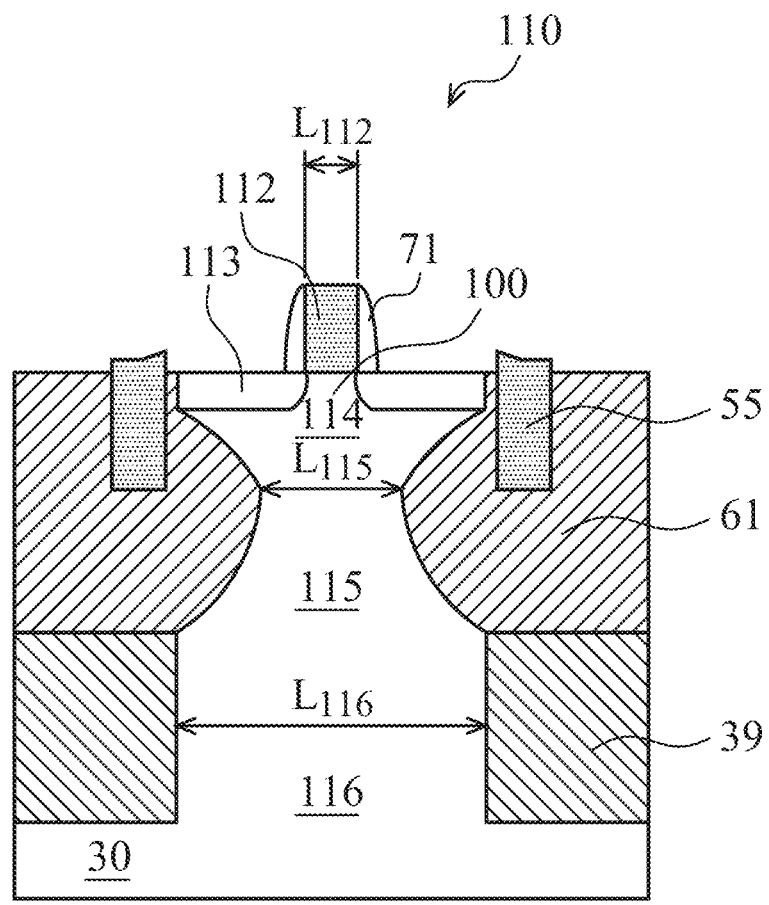

FIG. 2*c* illustrates an alternative embodiment of a first transistor 110 in which a first portion of first active region 115 comprises a balloon shaped region. In this embodiment, the thickness of the source/drain regions 113 increases towards the center of the channel. In various embodiments, a raised source/drain regions (not shown) may be formed to improve the source/drain resistance. The first transistor 110 illustrated in FIG. 2*c* exhibits a partial improvement in junction capacitance relative to a fully depleted SOI device. The depletion regions of the source/drain regions are limited by the spin on dielectric 61 as in a typical partially depleted SOI device.

Figure 2D:
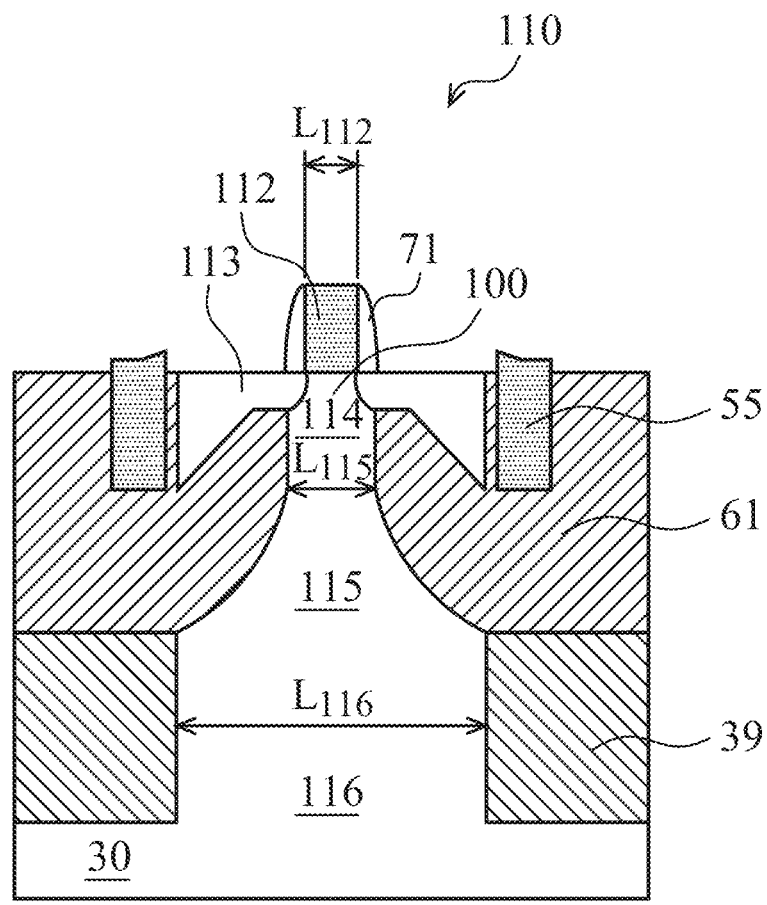

FIG. 2*d* illustrates an alternative embodiment of a first transistor 110 which a first portion of first active region 115 comprises a balloon shaped region (anisotropic region), and/or a faceted region. But unlike the embodiment illustrated in FIG. 2*c*, the thickness of the source/drain regions 113 decreases towards the center of the channel. Consequently, this embodiment includes the benefits of a fully depleted SOI device (due to reduced junction capacitance). But unlike conventional fully depleted SOI devices that have increased source/drain resistance (relative to bulk devices), this first transistor 110 has a source/drain resistance similar to a bulk device.

Figure 3A:
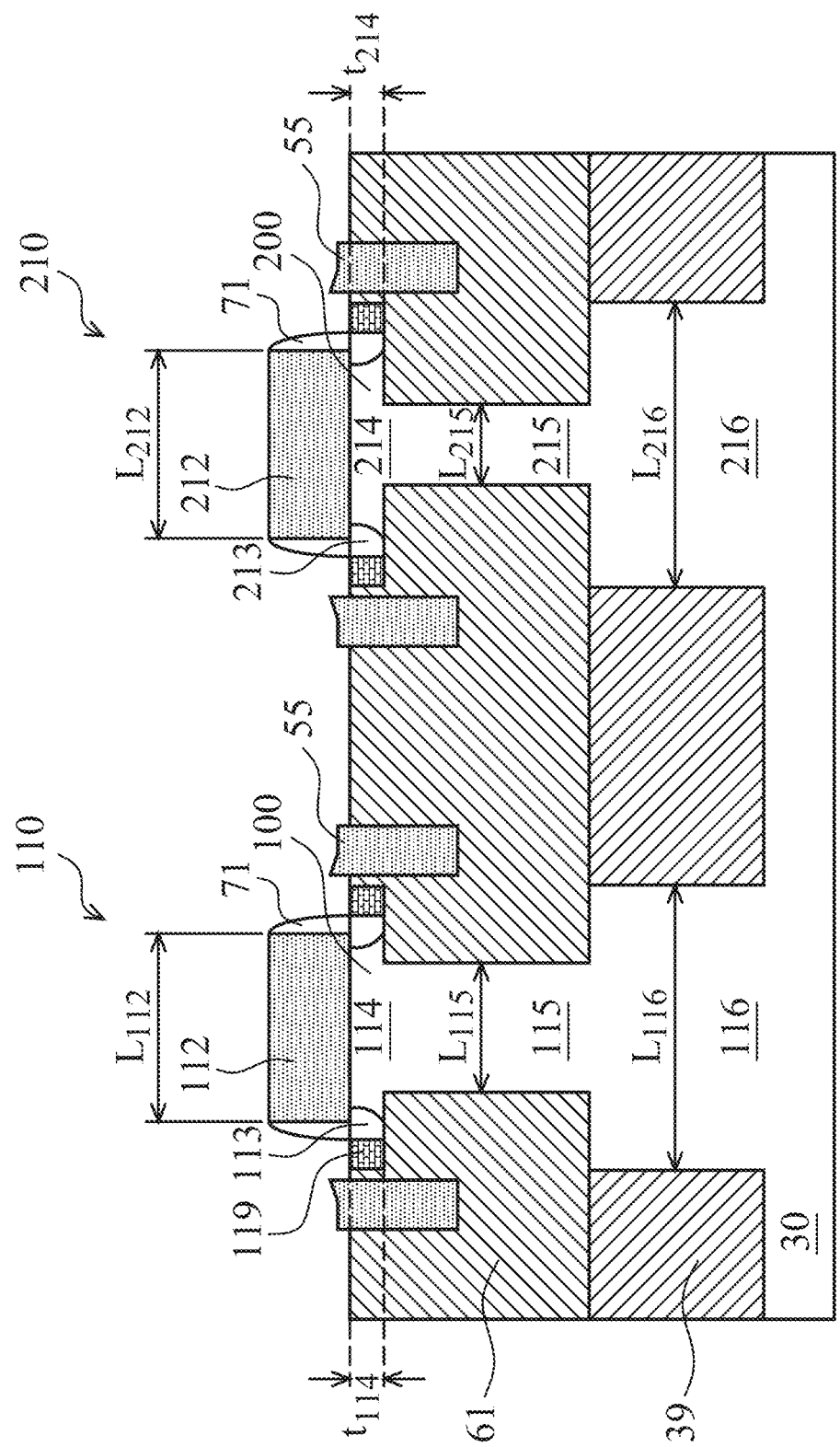
FIGS. 3a-3c, illustrates an embodiment of the invention describing a semiconductor device comprising multiple transistors on a same substrate.
Figure 3B:
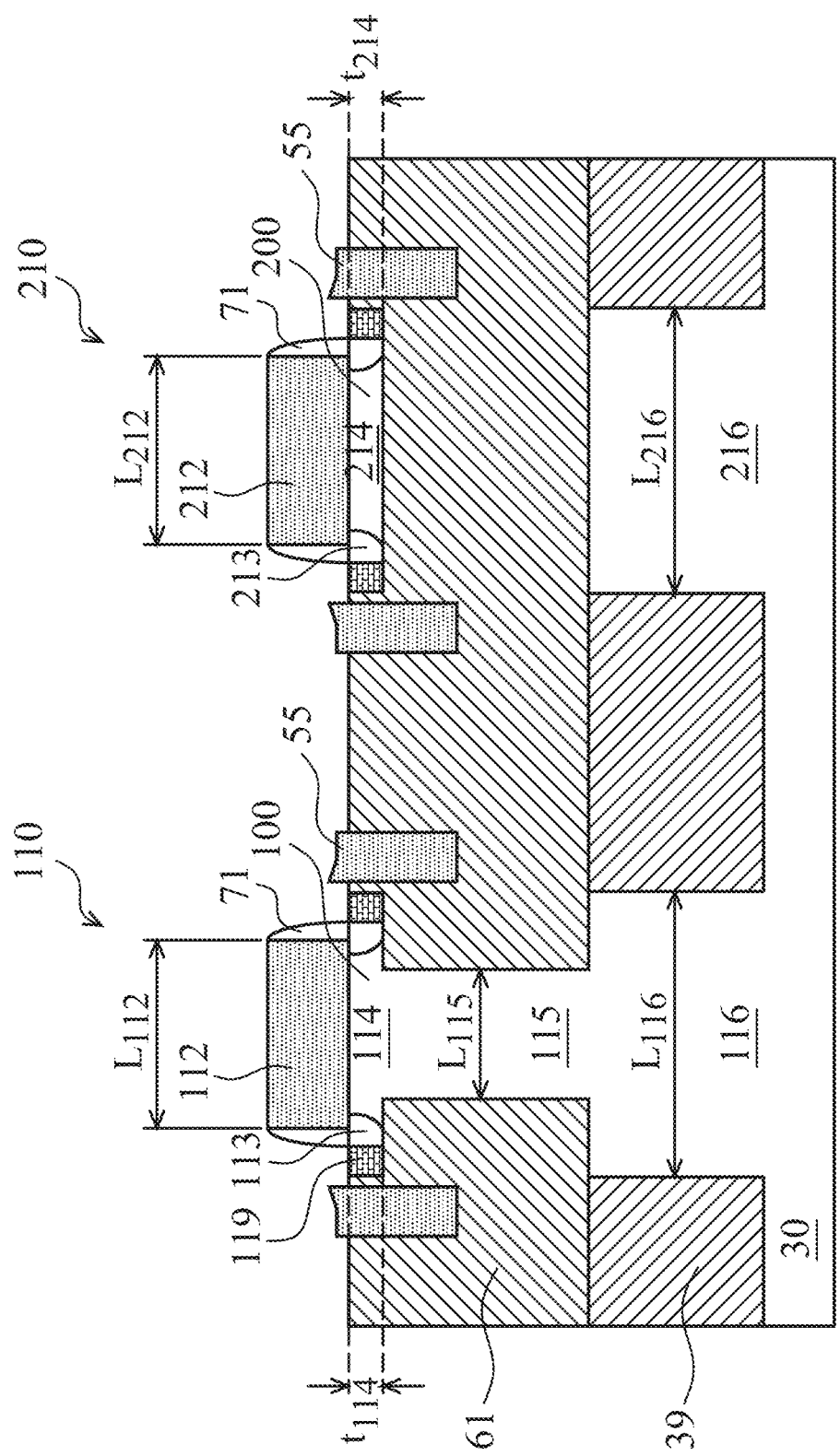
Figure 3C:
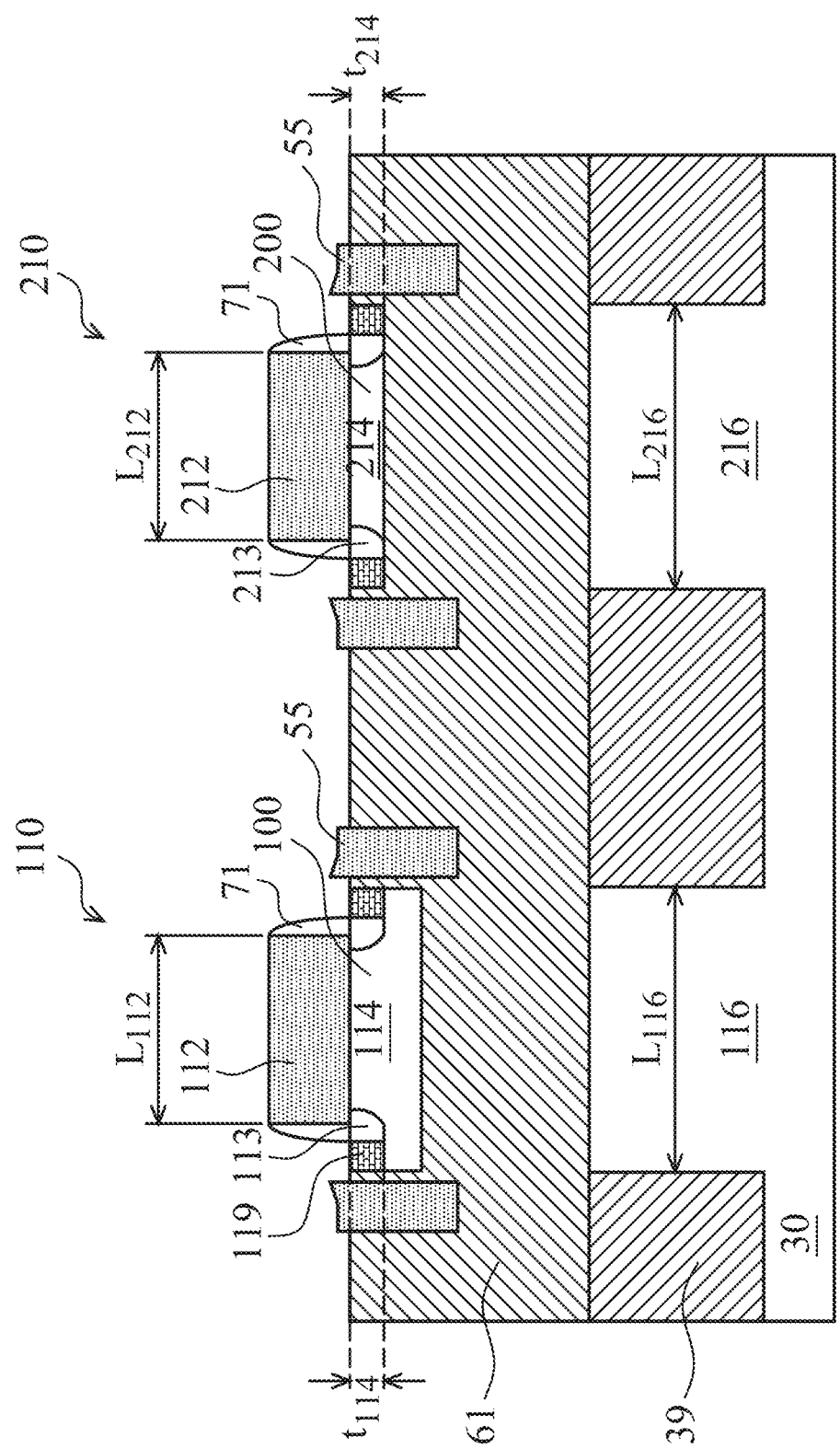

FIG. 3, which includes FIGS. 3*a*-3*c*, illustrates an embodiment of the invention describing a semiconductor device comprising multiple transistors on a same substrate.

FIG. 3*a* illustrates a first transistor 110 and a second transistor 210, wherein the first transistor 110 and the second transistor 210 comprise T-shaped regions. Referring to FIG. 3*a*, a first transistor 110 is disposed in a first active region 100 of a substrate 30 (as described in FIGS. 1 and 2). The first transistor 110 comprises a first gate stack 112, a first channel 114, and first source/drain regions 113. The second transistor 210 comprises a second gate stack 212, a second channel 214, and second source/drain regions 213.

The first transistor 110 comprises a first portion of first active region 115 and a second portion of first active region 116. The second transistor 210 similarly comprises a first portion of second active region 215 and a second portion of second active region 216. However, a width of the first portion of first active region L115 is different from a width of the first portion of second active region L215.

In one embodiment, this difference arises from the difference in width of the second portion of first active region L116 and the width of the second portion of second active region L216. If the width of the second portion of second active region L216 is smaller than the width of the second portion of first active region L116, and assuming no pattern density effects, the width of the first portion of first active region L115 is larger than the width of the first portion of second active region L215. However, other variations may be produced due to pattern density (e.g., isolated gates versus dense gates), and due to other process variations.

Hence, if the first and the second gate lengths L112 and L212 are about equal, the second transistor 210 has more spin on dielectric 61 underneath the second channel 214 than the first transistor 110.

FIG. 3b illustrates a fully depleted transistor disposed on the same substrate as other (non-fully depleted) transistors, in accordance with an embodiment of the invention. Referring to FIG. 3b, a first transistor 110 is disposed in a first active region 100 of a substrate 30 (as described in FIG. 1). The first transistor 110 comprises a first gate stack 112, a first channel 114, and first source/drain regions 113. The first channel 114 of the first transistor 110 is coupled to the substrate 30 through a first portion of first active region 115 and a second portion of first active region 116. In various embodiments, the width of the first portion of first active region 115 (L115) is less than the width of the second portion of first active region 116 (L116). The sidewalls of the first portion of the first active region 115 are enclosed with a spin on dielectric 61. The sidewalls of the second portion of the first active region 116 are enclosed with a dielectric material 39.

A second transistor 210 is disposed in a second active region 200 of a substrate 30. The second transistor 210 comprises a second gate stack 212, a second channel 214, and second source/drain regions 213. In various embodiments, the bottom surface of the first source/drain regions 113 is at least partially disposed on the spin on dielectric 61 while the bottom surface of the second source/drain regions 213 is disposed on the spin on dielectric 61.

However, unlike the first transistor 110, the body of the second transistor 210 is floating. In one embodiment, the second channel 214 of the second transistor 210 is not coupled to the substrate 30. Rather, the second channel 214 is separated from the substrate 30 by a spin on dielectric 61. Hence, the second transistor 210 comprises a fully depleted or a partially depleted transistor.

The second transistor 210 is fully depleted or partially depleted depending on the second thickness t214 of the second channel 214. In one embodiment, the second thickness t214 of the second channel 214 is about 5 nm to about 40 nm forming a fully depleted transistor. In an alternative embodiment, the second thickness t214 of the second channel 214 is about 50 nm to about 150 nm forming a partially depleted transistor. Hence, in various embodiments, a fully or partially depleted transistor is fabricated in the same substrate as a bulk device.

Further, in an alternative embodiment, both partially depleted and fully depleted transistors may be formed by forming a third transistor comprising a different thickness than the second thickness t214. In such an embodiment, if the second transistor 210 comprises a fully depleted transistor, the third transistor comprises a partially depleted transistor.

FIG. 3c illustrates an alternative embodiment, in which the both the first and the second transistors 110 and 210 comprise floating body devices. Hence, both the first and the second channels 114 and 214 are separated from the substrate 30 by a spin on dielectric 61. However, a first thickness t114 of the first channel 114 is different from a second thickness t214 of the second channel 214. In one embodiment, the first transistor 110 comprises a partially depleted transistor whereas the second transistor 210 comprises a fully depleted transistor.

Figure 4A:
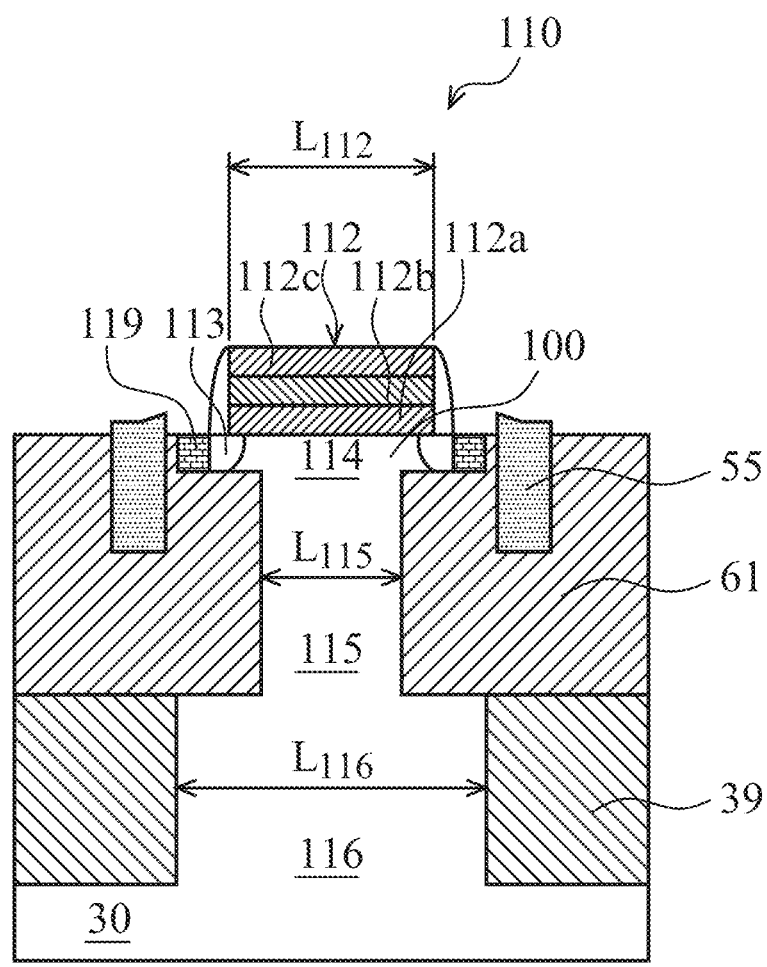
FIGS. 4a and 4b, illustrates non-volatile memories in accordance with embodiments of the invention.
Figure 4B:
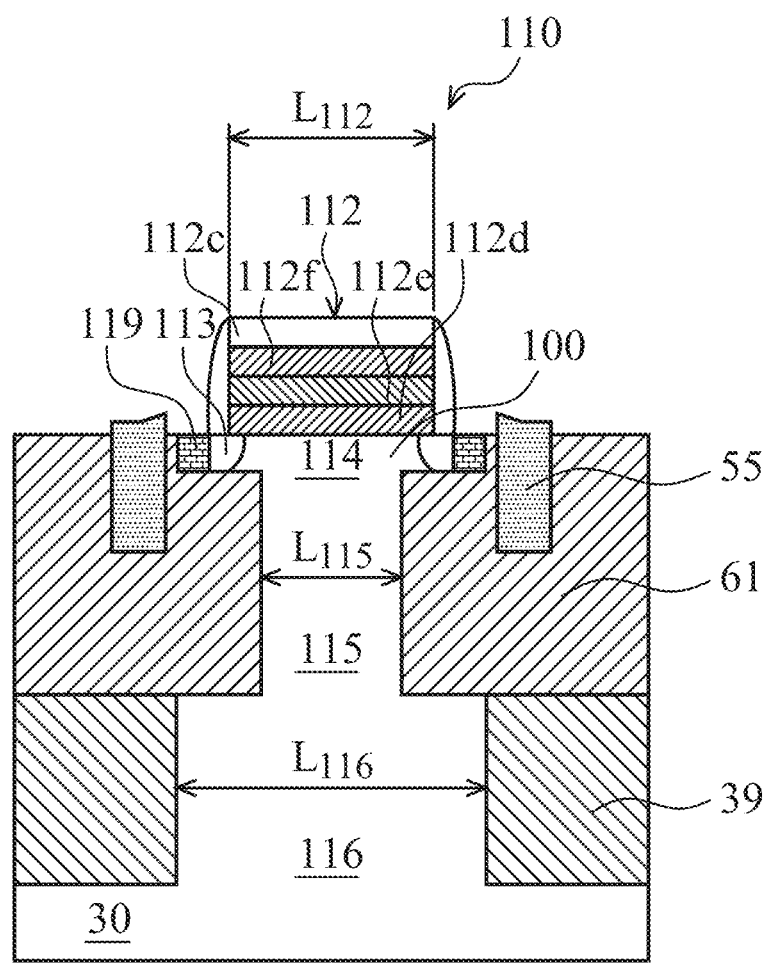

FIG. 4, which includes FIGS. 4a and 4b, illustrates non-volatile memories in accordance with embodiments of the invention.

In FIG. 4, the first transistor 110 is similar to the embodiments described above (e.g., FIG. 1), except for the gate stack. Referring to FIG. 4a, the first gate stack 112 comprises a floating gate 112a is disposed on a gate dielectric (not shown), an inter level dielectric 112b which is disposed on the floating gate 112a and a control gate 112c is disposed on the inter level dielectric 112b, thus forming a flash memory.

In an alternative embodiment, the first gate stack 112 comprises a tunnel dielectric 112d which is disposed on the first channel 114, a charge trap layer 112e which is disposed on the tunnel dielectric 112d, and an inter level dielectric 112f which is disposed on the charge trap layer 112e. A control gate 112c is disposed on the inter level dielectric 112f, thus forming the non-volatile memory (FIG. 4b). Although not described individually, in various embodiments, the non-volatile memories described herein may be formed using any of the embodiments described with respect to FIGS. 1-3.

Figure 5A:
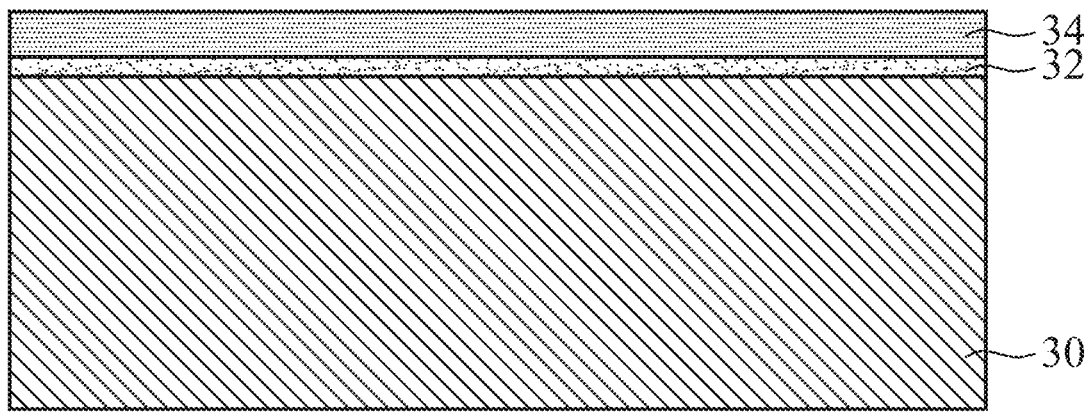
FIGS. 5a-5p, illustrates a semiconductor device in various stages of fabrication in accordance with an embodiment of the invention.
Figure 5B:
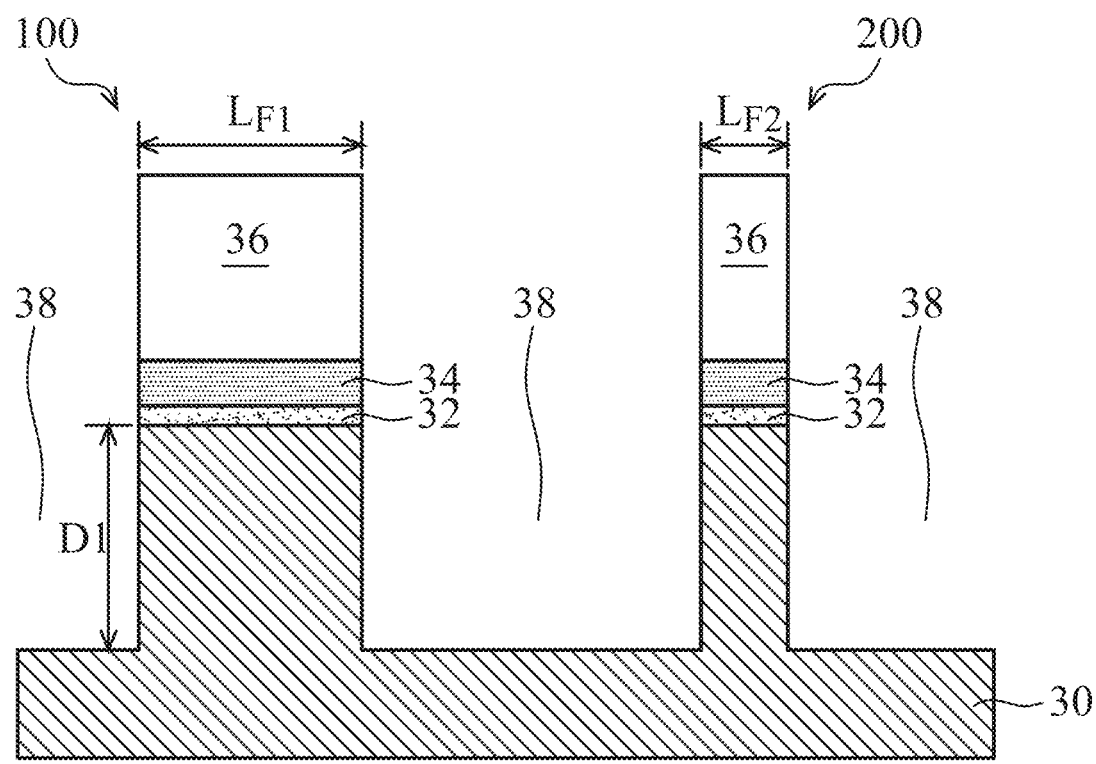
FIG. 5, which includes
Figure 5C:
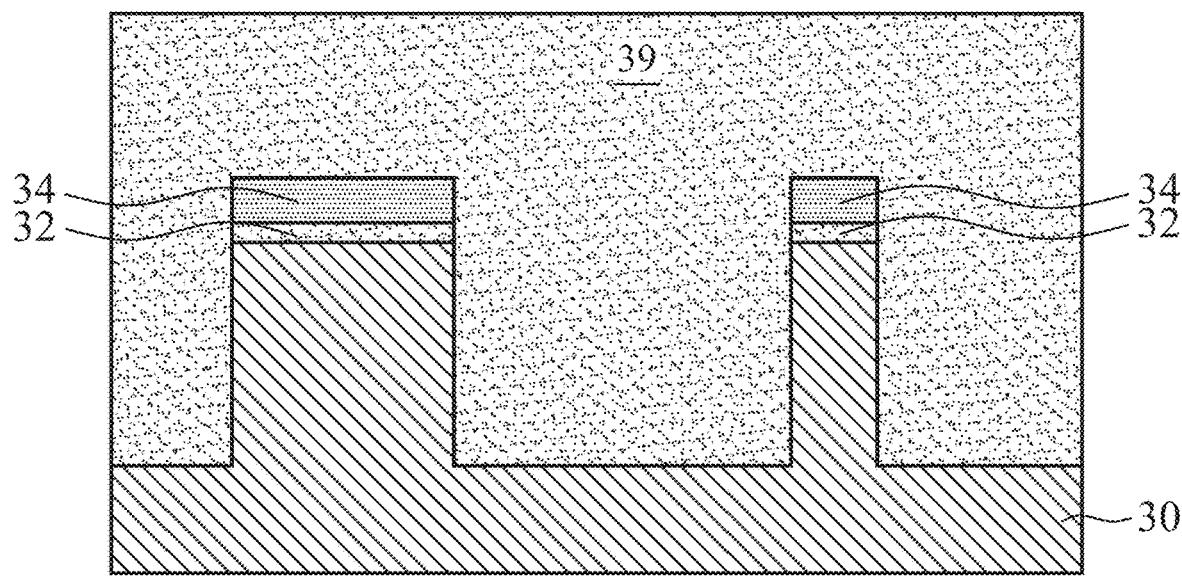
Figure 5D:
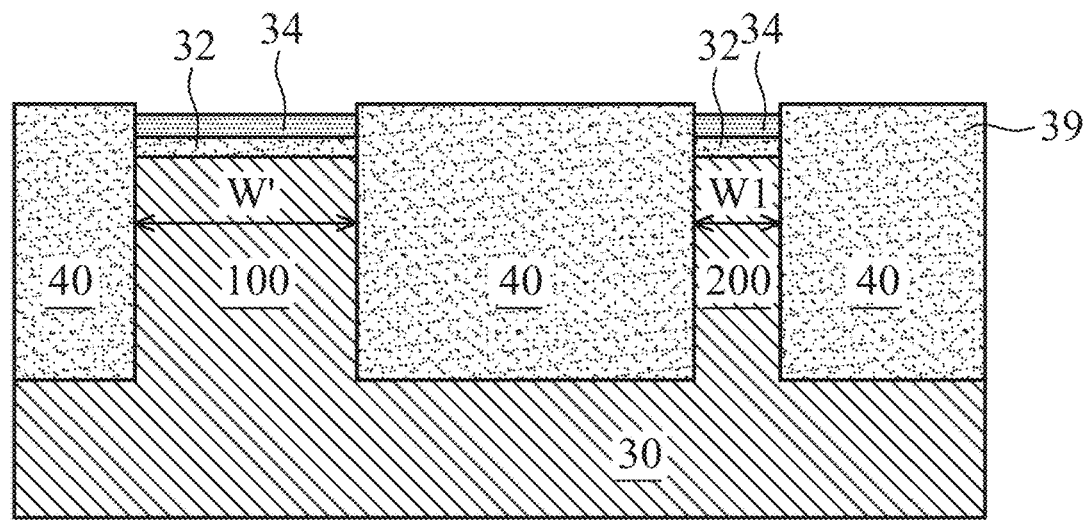
Figure 5E:
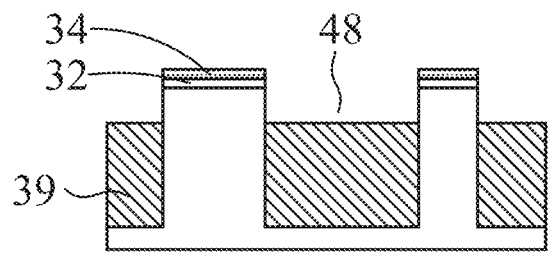
Figure 5F:
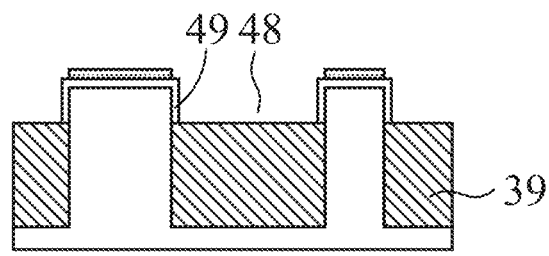
Figure 5G:
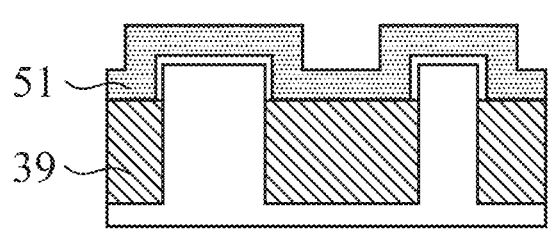
Figure 5H:
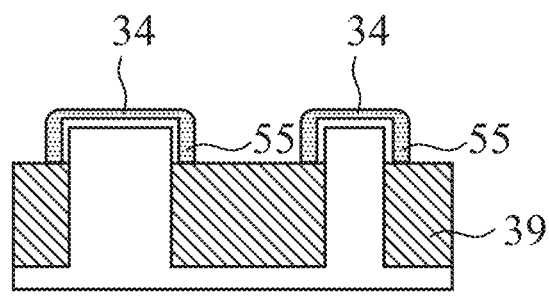
Figure 5I:
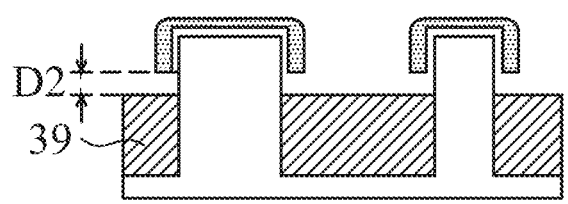
Figure 5J:
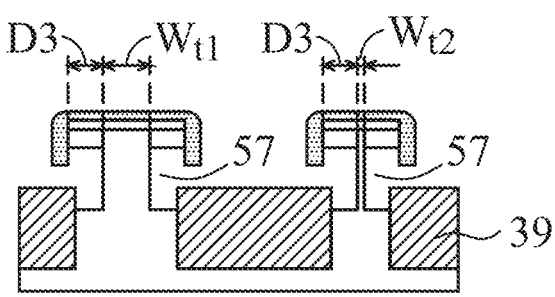
Figure 5K:
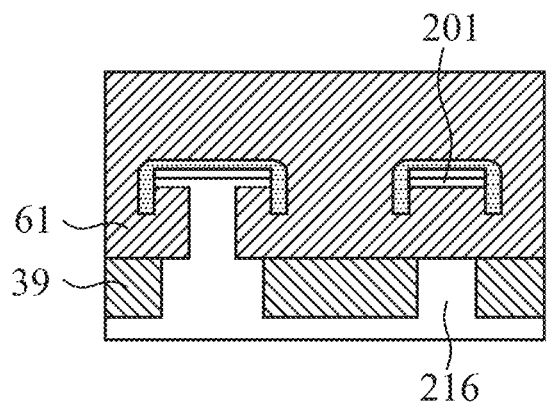
Figure 5L:
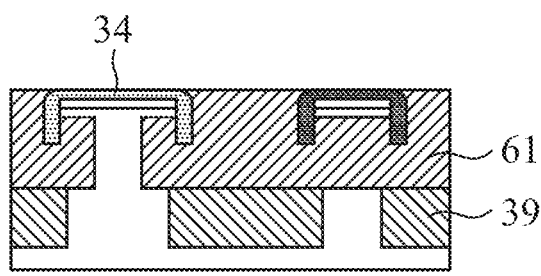
Figure 5M:
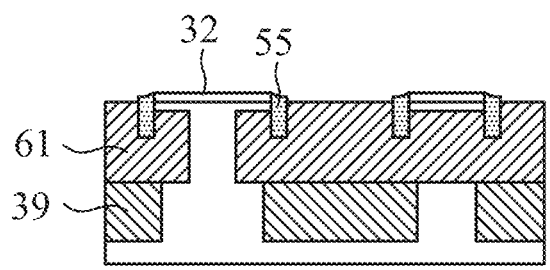
Figure 5N:
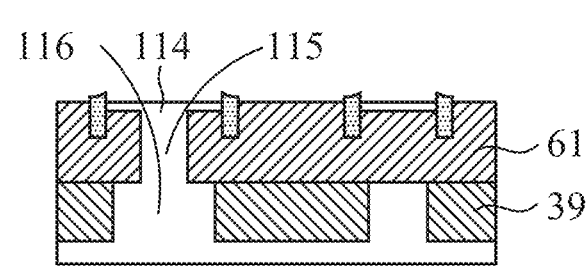
Figure 5O:
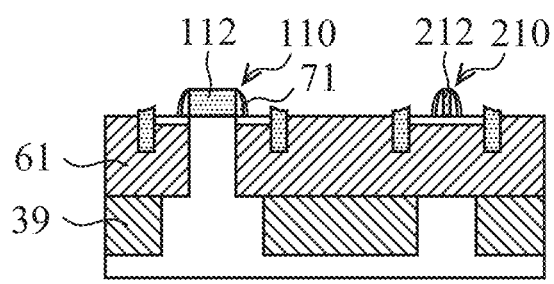
Figure 5P:
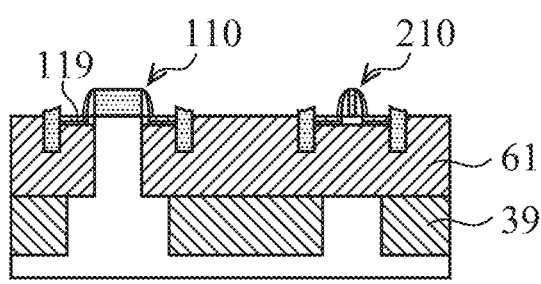
Figure 6A:
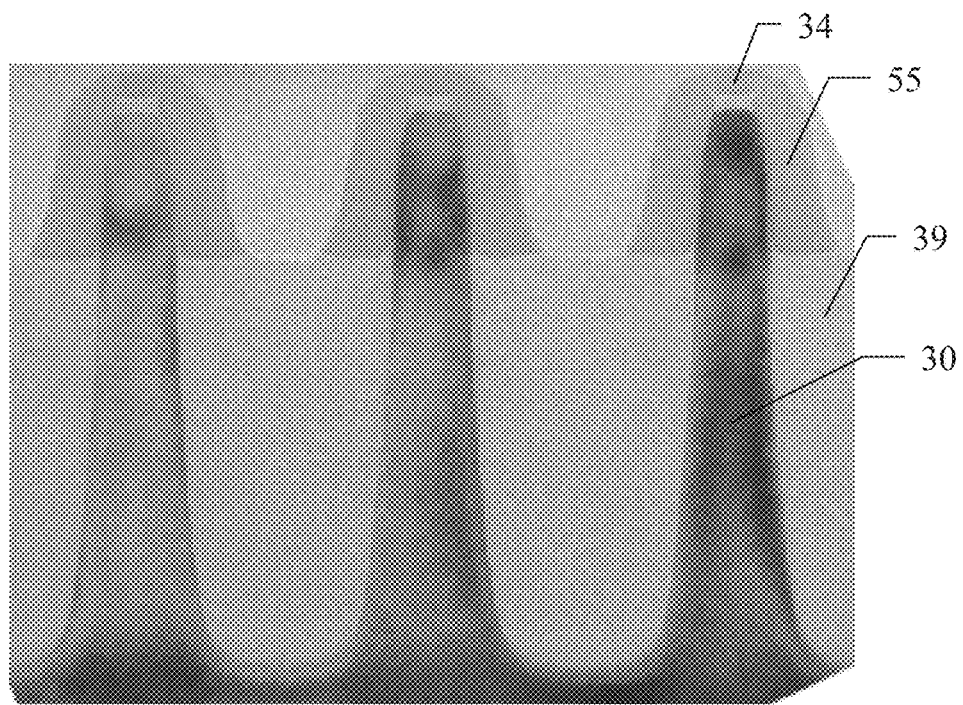
FIGS. 6a-6c, illustrates electro micrographs of a semiconductor device in various stages of fabrication in accordance with an embodiment of the invention.
Figure 6B:
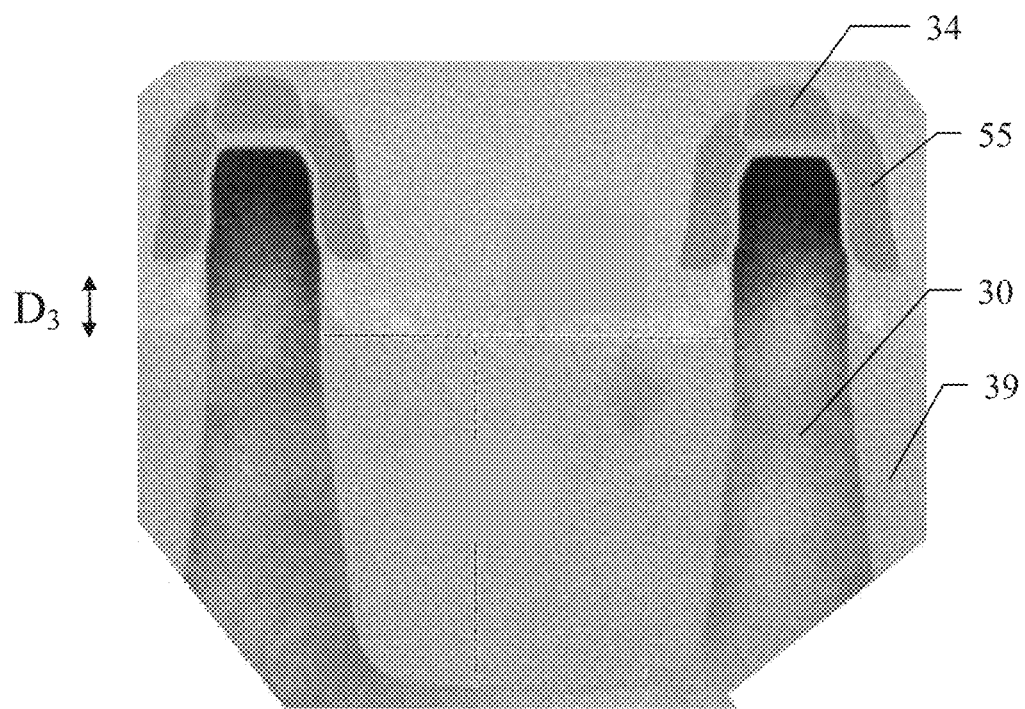
Figure 6C:
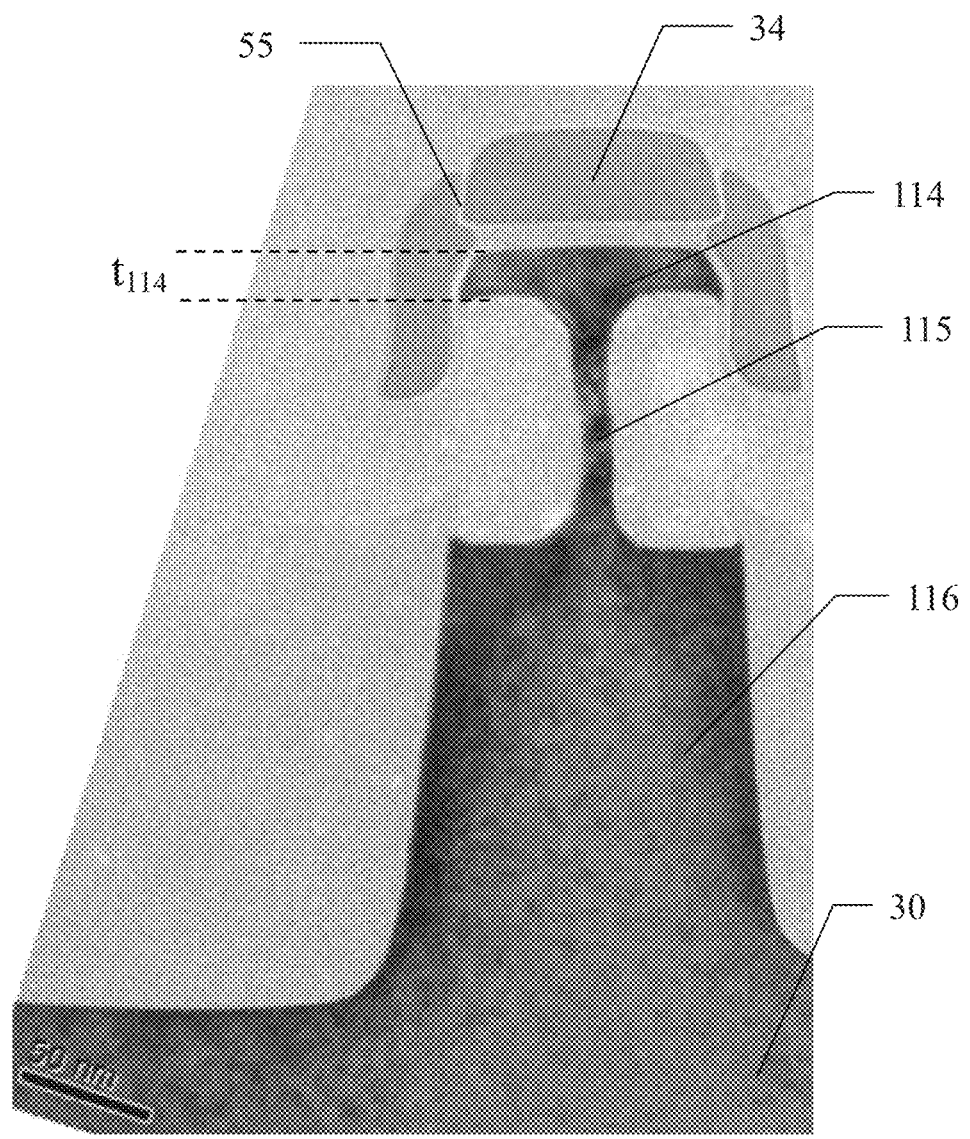

FIG. 5, which includes FIGS. 5a-5p, illustrates a semiconductor device in various stages of fabrication in accordance with an embodiment of the invention. FIG. 6, which includes FIGS. 6a-6c, illustrates electron microscopic images of a structure fabricated in accordance with embodiments of the invention.

Referring to FIG. 5a, a semiconductor substrate 30 is provided. In one embodiment, the semiconductor substrate 30 is a bulk silicon substrate. In various embodiments, semiconductor substrate 30 may comprise a single crystal or a material stack comprising multiple material layers, and may include an epitaxial layer. In some embodiments, the substrate 30 may comprise a compound semiconductor. The substrate 30 may comprise other commonly used materials, such as carbon, germanium, gallium, arsenic, nitrogen, indium, phosphorus, and the like.

A pad layer 32 and a first mask layer 34 are formed on the semiconductor substrate 30. Pad layer 32 is a thin film formed through a thermal process, for example, including silicon oxide in one embodiment. The pad layer 32 protects the semiconductor substrate 30 to minimize defectivity in the substrate 30 (e.g., stress from the first mask layer 34).

The pad layer 32 may also act as an etch stop layer for etching the subsequently formed first mask layer 34. In one embodiment, the first mask layer 34 comprises silicon nitride deposited using low-pressure chemical vapor deposition (LPCVD). In alternative embodiments, the first mask layer 34 is formed by thermal nitridation of silicon, chemical vapor deposition (CVD) such as plasma enhanced CVD (PECVD), low pressure CVD (LPCVD), or plasma anodic nitridation using nitrogen-hydrogen. In various embodiments, the first mask layer 34 comprises a thickness of about 60 nm to about 120 nm. However, the dimensions described throughout the description are merely examples, and may change if the integrated circuits are formed using different technologies.

Referring to FIG. 5b, a photoresist 36 is deposited on the first mask layer 34, and patterned, forming first openings 38 in the photoresist 36. The first mask layer 34 and the pad layer 32 are then etched through the first openings 38, exposing underlying semiconductor substrate 30. Next, semiconductor substrate 30 is etched, so that first openings 38 extend into semiconductor substrate 30. In one embodiment, a first recess depth D1 in the semiconductor substrate 30 is between about 100 nm and about 300 nm. In one embodiment, a first width of the first portion of the substrate 30 LF1 in the first active region 100 is larger than a second width of the fin portion of the substrate 30 LF2 in the second active region 200.

Referring to FIG. 5c, the first openings 38 are filled with a dielectric material 39. In one embodiment, the dielectric material 39 comprises silicon oxide, for example, formed by sub-atmospheric chemical vapor deposition (SA-CVD). In other embodiments, the dielectric material 39 is formed by high-density plasma chemical vapor deposition (HDP-CVD) or spin on glass (SOG). The trench fill can be a single material or multiple materials. In other embodiments, other trench filling processes can be used. For example, while the trench is typically lined, this step can be avoided with newer fill materials.

As illustrated in FIG. 5d, a chemical mechanical polish (CMP) is then performed to planarize the surface of the wafer, forming shallow trench isolation (STI) regions 40. The first mask layer 34 is used as a CMP stop layer. The STI regions 40 separate a first active region 100, which is used for forming a first transistor, and a second active region 200, which is used for forming a second transistor. In one embodiment, a ratio of the width W' of the first active region 100 to a width W1 of the second active region 200 is greater than about 1.

Referring to FIG. 5e, the STI regions 40 are recessed to form second openings 48. In various embodiments, the second openings 48 are formed by a substantially anisotropic etching, for example, using a dry etch chemistry. In one embodiment, the second openings 48 are formed by a reactive ion etching process using a gas chemistry comprising CHF3, C4F8, and CO. In some embodiments, the second openings 48 are formed by an isotropic wet etching process. In various embodiments, a second recess depth D2 of the second openings 48 is about 10 nm to about 100 nm.

As next described in FIG. 5f, the substrate is annealed in hydrogen to smooth the exposed sidewall surface of the substrate 30 (exposed by the recess). An oxide liner 49 is deposited over the exposed sidewall, for example, using a thermal oxidation process. In another embodiment, the oxide liner 49 is formed by a process of deposition and etching forming a sidewall on the exposed sidewall surface of the substrate 30. In various embodiments, the oxide liner 49 comprises a thickness of about 1 nm to about 20 nm, and about 5 nm to about 10 nm in one embodiment.

A second mask layer 51 is deposited over the substrate 30 as illustrated in FIG. 5g. The second mask layer 51 comprises silicon nitride deposited using, for example, low-pressure chemical vapor deposition (LPCVD). In alternative embodiments, the second mask layer 51 is formed by thermal nitridation of silicon, chemical vapor deposition (CVD) such as plasma enhanced CVD (PECVD), low pressure CVD (LPCVD), or plasma anodic nitridation using nitrogen-hydrogen. In different embodiments, the second mask layer 51 comprises silicon nitride, silicon oxy-nitride, titanium nitride, silicon containing ARC layer, amorphous carbon layer and/or a silicon-containing low-k layer. Although only a single layer of the second mask layer 51 is shown in FIG. 5g, the second mask layer 51 may comprise multiple layers. In various embodiments, the second mask layer 51 comprises a thickness of about 10 nm to about 80 nm.

The second mask layer 51 is etched using an anisotropic etch exposing the first mask layer 34. In one embodiment, the second mask layer 51 is etched using a reactive ion etch process using a gas chemistry comprising CF4/O2, CF4/H2, CHF3/O2, and/or CH2F2. The remaining second mask layer 51 forms a spacer 55 as illustrated in FIG. 5h. Together, the first mask layer 34 and the second mask layer 51 enclose a portion of the substrate 30. In one embodiment, an end point detection scheme based on detecting the dielectric material 39 on the STI regions 40 is used. Alternatively, a timed etch may be used. An electron microscopic image of a corresponding structure at this stage of processing is illustrated in FIG. 6a.

Referring to FIG. 5i, a wet etch process etches the oxide liner 49 and recesses the STI regions 40. In one embodiment, the wet etch process comprises a hydro fluoric acid chemistry with the optimized NH4F/HF ratio. In various embodiments, the wet etch is processed at a temperature of about 20° C. to about 100° C., and about 22° C. to about 26° C. in one embodiment. The pH value of the etchant is about 5 to about 8, and about 6 to about 7 in one embodiment. In various embodiments, the etchant etches a high density plasma (HDP) oxide faster than a thermal oxide, for example, by about 1.3 to about 1.5. In one embodiment, the etchant etches a high density plasma (HDP) oxide faster than a thermal oxide, for example, by about 1.43. In various embodiments, the etch rate of the etchant is higher on a SA-CVD oxide and tetraethoxysilane (TEOS) oxide than thermal oxide. In one embodiment, the etchant etches SA-CVD oxide faster than a thermal oxide, for example, by about 4.5 to about 4.7. In one embodiment, the etchant etches TEOS oxide faster than a thermal oxide, for example, by about 4.3 to about 4.5. In various embodiments, the etchant etches a nitride slower than a thermal oxide, for example, by about 0.3 to about 0.6, and about 0.5 in one embodiment. The STI regions 40 are recessed to a second recess depth D2 below the spacers 55. In various embodiments, a second recess depth D2 is about 10 nm to about 50 nm. An electron microscopic image of a corresponding structure at this stage of processing is illustrated in FIG. 6b.

As next illustrated in FIG. 5j, a selective wet etch is used to etch a portion of the substrate 30 to form lateral openings 57. In one embodiment, the selective wet etch comprises an etchant comprising Tetramethylammonium hydroxide (TMAH) as it enables selective crystallographic etching of silicon. In one embodiment, the selective wet etch comprises HF and HNO3. The selective wet etch removes a portion of the substrate 30 disposed under the first and the second mask layers 34 and 51. TMAH ratio is about 30% to about 45% by volume in one embodiment. In one embodiment, the temperature of the selective wet etch temperature is about 30° C. to about 50° C.

The lateral openings 57 recess into the substrate 30 by a third recess depth D3. The third recess depth D3 is about 5 nm to about 50 nm in various embodiments, and about 10 nm to about 20 nm. In various embodiments, the selective etch leaves a thin "T" shaped portion of the substrate 30 under the first mask layer 34. The thin "T" shaped portion of the substrate 30 ensures mechanical stability of the upper surface layer during subsequent processing. In various embodiments, a first width of the "T" shaped portion of the substrate 30 Wt1 is larger than a second width of the "T" shaped portion of the substrate 30 Wt2. An electron microscopic image of a corresponding structure at this stage of processing is illustrated in FIG. 6c. As illustrated in FIGS. 5j and 6c, the structure now comprises an upper region (e.g., for forming a first channel 114), a first portion of first active region 115, and a second portion of first active region 116. The thickness of the first channel t114 thus formed is also illustrated.

In some embodiments, transistors of a single conductivity type undergo the above processes of forming the lateral openings 57. For example, in one embodiment, NMOS transistors are fabricated to form the T-shaped portion as described above, whereas PMOS transistors are masked during this process so that planar bulk devices can be formed on the PMOS transistors. For example, in one embodiment, PMOS transistors are masked so that epitaxial SiGe devices can be grown on the PMOS areas. Similarly, in some embodiments, only transistors of a particular gate length or transistors smaller than a particular gate length are processed to form the T-shaped region, while the larger transistors are masked and form conventional bulk transistors.

A spin on dielectric 61 is coated over the substrate 30 followed by a thermal anneal (FIG. 5*k*). The spin on dielectric covers the "T" shaped portions of the substrate 30. In various embodiments, the spin on dielectric 61 comprises a spin on glass, or other dielectric materials, that may be applied in a liquid form. The liquid dielectric fills up the lateral openings 57 (shown in FIG. 5*j*). In one embodiment, a spin-on-glass (SOG) oxide is used as the spin on dielectric 61 because of the good gap-filling capacity. If the spin on dielectric 61 comprises an oxide material, the spin on dielectric 61 consumes a portion of the substrate 30 upon thermal annealing. In various embodiments, the thermal annealing comprises heating the substrate 30 in a furnace at a temperature greater than about 1000° C., and greater than about 1100° C. in one embodiment.

In various embodiments, if the second width of the "T" shaped portion of the substrate 30 Wt2 is smaller than a critical width, the thin section of the "T" shaped portion of the substrate 30 is completely removed in the second active areas 200. This forms an island 201 over the substrate 30 and a remaining portion 216 of the substrate 30. Further, if the first width of the "T" shaped portion of the substrate 30 Wt1 is smaller than the critical width, the thin vertical section of the "T" shaped portion of the substrate 30 is completely removed from both the first and the second active areas 100 and 200.

Referring to FIG. 5*l*, the spin on dielectric 61 is planarized using a chemical mechanical planarization step. The chemical mechanical planarization exposes the first mask layer 34. A subsequent etching step removes the first mask layer 34 exposing the pad layer 32 as illustrated in FIG. 5*m*. In various embodiments, the first mask layer 34 is removed using a wet etch, a plasma etching process, or as a continuation of the chemical mechanical planarization step. The pad layer 34 is removed as next illustrated in FIG. 5*n*. As illustrated in FIG. 5*n*, the structure now comprises an upper region (e.g., for forming a first channel 114 of the first transistor 110), a first portion of first active region 115, and a second portion of first active region 116.

In some embodiments, an angled implant (at two or four rotations) may be performed into the lateral openings 57 to dope the first portion of first active region 115, and the second portion of first active region 116. This implant is performed before filling the lateral openings 57 with the spin on dielectric 61. For example, in NMOS areas, a p-type implant may be performed to further decrease source to drain leakage currents.

As illustrated in FIG. 5*o*, a first transistor 110 and a second transistor 210 are formed in the first and the second active areas 100 and 200. In forming the first and the second transistors 110 and 210, a well implant initially dopes the first active areas 100 and the second active areas 200. The well implant is selected to have a conductivity type opposite to that of the source/drain doping. A gate dielectric layer (not shown) is formed over the first and the second active areas 100 and 200. In various embodiments, the gate dielectric layer may be formed of high-k dielectric materials.

A gate electrode layer (not shown) is formed over the gate dielectric layer forming a gate stack. The gate electrode layer may comprise metals, metal silicides, polysilicon, metal nitrides, and the like. Gate stacks may be formed using gate-first approaches or gate-last approaches.

In the gate-first approach, the gate electrode is deposited on the gate dielectric layer. The gate dielectric layer and the gate electrode layer are patterned to form a first gate stack 112 and a second gate stack 212. Next, drain extension regions are formed by implanting a dopant and optionally a halo implant of an opposite conductivity type, followed by the formation of gate spacers 71. Source/drain regions are then formed by implanting the exposed active regions 100 and 200 followed by an activation annealing. A silicide region (contact regions 119) is formed on the source/drain regions (FIG. 5*p*). A contact etch stop layer is deposited followed by an inter-layer dielectric, and contact plugs (also not shown). Subsequent processing continues as in conventional processing. The process details are well known in the art, and hence are not repeated herein.

In a gate-last approach (not shown), dummy gates are deposited on the gate dielectric layer. In one embodiment, the dummy gates, comprising a layer of TiN or TaN, is deposited followed by a layer of polysilicon. Next, LDD regions are formed, followed by the formation of gate spacers 71. Source/drain regions are then formed by an implantation to exposed active regions 100 and 200 and an activation annealing. Source/drain silicides are then formed, followed by the formation of contact etch stop layer, and inter-layer dielectric. The inter-layer dielectric is polished to expose the dummy gates, and at least a portion of the dummy gates is etched and removed. The etched out portion of the dummy gates is replaced by a metallic layer and/or semiconductor layer. Contact plugs are then formed.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a substrate;
   an active area in the substrate, the active area, when viewed in cross section, having
   a lower portion with a first width laterally bounded on a first side and a second side by a first dielectric layer and a second dielectric layer, respectively,
   a mid portion, above the lower portion, the mid portion having a second width laterally bounded by a third dielectric layer and a fourth dielectric layer, respectively, the second width being less than the first width and the third and fourth dielectric layers at least partially disposed over the first and second dielectric layers, the third and fourth dielectric layers being distinct layers from the first and second dielectric layers, and a channel portion, the channel portion having a third width bounded by a first source/drain region and a second source/drain region, respectively, the third width being less than the second width, wherein the lower portion, the mid portion, and the channel portion are a continuous semiconductor region;

a gate structure formed, at least in part, above the channel portion; and spacers on opposing sides of the channel portion, the spacers being separated from the active area by the third dielectric layer and the fourth dielectric layer.

2. The semiconductor device of claim 1, wherein a width of the channel portion is less than a smallest width of the mid portion.

3. The semiconductor device of claim 1, wherein sidewalls of the third dielectric layer are convex.

4. The semiconductor device of claim 1, wherein the active area extends below the first source/drain region and the second source/drain region.

5. The semiconductor device of claim 1, wherein the active area extends above at least portions of the first dielectric layer and the second dielectric layer.

6. The semiconductor device of claim 1, wherein a thickness of the third dielectric layer and the fourth dielectric layer is between about 10 nm to about 150 nm.

7. A semiconductor device comprising:
a substrate;
a first dielectric layer;
a first active area bounded laterally by the first dielectric layer, the first active area having a first thickness;
a second active area bounded laterally by the first dielectric layer, the first active area being laterally offset from the second active area, the second active area having a second thickness different than the first thickness, the first dielectric layer extending under each of the first active area and the second active area, top surfaces of the first active area and the second active area being at a same level; and
a second dielectric layer below the first dielectric layer, the substrate being interposed between portions of the second dielectric layer.

8. The semiconductor device of claim 7, wherein the first active area comprises a first source/drain region, wherein the second active area comprises a second source/drain region, and wherein the first dielectric layer extends immediately below the second source/drain region.

9. The semiconductor device of claim 8, wherein the first source/drain region is spaced apart from the first dielectric layer.

10. The semiconductor device of claim 7, further comprising a first gate electrode over the first active area, wherein a width of the first gate electrode is less than a width of a first portion of the substrate, the first portion being laterally below the first gate electrode, the first portion being laterally bounded by portions of the second dielectric layer.

11. The semiconductor device of claim 10, further comprising a second gate electrode over the second active area, wherein a width of the second gate electrode is less than a width of a second portion of the substrate, the second portion being laterally below the second gate electrode, the second portion being laterally bounded by portions of the second dielectric layer.

12. A semiconductor device comprising:
a substrate;
an active area in the substrate, the active area comprising:
a lower portion with a first width laterally bounded by a first dielectric material,
an upper portion with a second width laterally bounded by a second dielectric material, the upper portion including a source region, a drain region, and a channel region, the second dielectric material having a lower surface disposed on an upper surface of the first dielectric material, and
a mid portion interposed between the lower portion and the upper portion, the mid portion having a third width, the third width being a narrowest width laterally bounded by the second dielectric material, the third width being less than the first width and the second width;
a gate structure formed, at least in part, above the upper portion; and
a dielectric spacer on opposing sides of the upper portion, the dielectric spacer being separated from the active area by the second dielectric material.

13. The semiconductor device of claim 12, wherein a width of the channel region is less than the third width.

14. The semiconductor device of claim 12, wherein a width of the mid portion increases as the mid portion extends toward the lower portion.

15. The semiconductor device of claim 12, wherein the mid portion is laterally bounded by a first dielectric layer, the lower portion is laterally bounded by a second dielectric layer different than the first dielectric layer.

16. The semiconductor device of claim 12, wherein the upper portion and the mid portion are laterally bounded by a same dielectric layer.

17. The semiconductor device of claim 12, wherein a thickness of the upper portion in the source region increases as the upper portion extends away from the channel region.

18. The semiconductor device of claim 12, wherein sidewalls of the second dielectric material are convex.

19. The semiconductor device of claim 12, wherein the dielectric spacer surrounds the upper portion.

20. The semiconductor device of claim 12, wherein the second dielectric material extends below the source region and the drain region.

* * * * *

UNITED STATES PATENT AND TRADEMARK OFFICE
CERTIFICATE OF CORRECTION

PATENT NO.         : 11,114,563 B2  
APPLICATION NO.    : 15/942639  
DATED              : September 7, 2021  
INVENTOR(S)        : Cheng-Hung Chang Page 1 of 1

It is certified that error appears in the above-identified patent and that said Letters Patent is hereby corrected as shown below:

On the Title Page

Item (72), Inventors; insert --City-- after "Tainan".

Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*